(12) United States Patent
Jian et al.

(10) Patent No.: US 12,237,272 B2
(45) Date of Patent: Feb. 25, 2025

(54) ELECTRONIC DEVICE AND METHOD OF MANUFACTURING THE SAME

(71) Applicant: Advanced Semiconductor Engineering, Inc., Kaohsiung (TW)

(72) Inventors: Hui-Ping Jian, Kaohsiung (TW); Ming-Hung Chen, Kaohsiung (TW); Jia-Feng Ho, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 292 days.

(21) Appl. No.: 17/548,333

(22) Filed: Dec. 10, 2021

(65) Prior Publication Data
US 2023/0187374 A1 Jun. 15, 2023

(51) Int. Cl.
| | | |
|---|---|---|
| *H01L 23/552* | (2006.01) | |
| *H01L 21/56* | (2006.01) | |
| *H01L 23/13* | (2006.01) | |
| *H01L 23/498* | (2006.01) | |
| *H01Q 1/22* | (2006.01) | |
| *H01L 23/31* | (2006.01) | |

(52) U.S. Cl.
CPC .......... *H01L 23/552* (2013.01); *H01L 21/561* (2013.01); *H01L 23/13* (2013.01); *H01L 23/49838* (2013.01); *H01Q 1/2283* (2013.01); *H01L 23/3121* (2013.01); *H01L 23/49822* (2013.01)

(58) Field of Classification Search
None
See application file for complete search history.

(56) References Cited

U.S. PATENT DOCUMENTS

| | | | | |
|---|---|---|---|---|
| 11,823,973 | B2 * | 11/2023 | Park | H01L 23/3675 |
| 11,830,785 | B2 * | 11/2023 | Lee | H01L 23/16 |
| 2019/0103653 | A1 | 4/2019 | Jeong et al. | |
| 2021/0366838 | A1 * | 11/2021 | Han | H01L 23/49838 |
| 2023/0187374 | A1 * | 6/2023 | Jian | H01Q 1/526 |
| | | | | 257/224 |

* cited by examiner

*Primary Examiner* — Long Pham
(74) *Attorney, Agent, or Firm* — FOLEY & LARDNER LLP

(57) ABSTRACT

An electronic device is disclosed. The electronic device includes a carrier having a first surface and a first lateral surface, an antenna adjacent to the first surface of the carrier, and a shielding layer covering a portion of the first lateral surface of the carrier. The shielding layer is configured to allow a gain of the antenna to be greater than 20 dB.

4 Claims, 25 Drawing Sheets

ELECTRONIC DEVICE AND METHOD OF MANUFACTURING THE SAME

BACKGROUND

1. Field of the Disclosure

The present disclosure generally relates to an electronic device and a method of manufacturing an electronic device.

2. Description of the Related Art

Antenna package(s) having antennas for signal (e.g., radio frequency (RF) signal) transmission and reception may include an antenna layer and an RF routing layer electrically connected thereto. In some existing techniques for forming an electromagnetic interference (EMI) shielding layer on an antenna package, a tape (e.g., a thermally stable tape) may be utilized to protect the antenna layer. The thermally stable tape may cover the antenna layer and prevent the antenna layer from being overlapped or covered by the EMI shielding layer.

SUMMARY

Embodiments of the present disclosure provide an electronic device. The electronic device includes a carrier having a first surface and a first lateral surface, an antenna adjacent to the first surface of the carrier, and a shielding layer covering a portion of the first lateral surface of the carrier. The shielding layer is configured to allow a gain of the antenna to be greater than 20 dB.

Embodiments of the present disclosure provide an electronic device. The electronic device includes a carrier having an antenna region, a first surface over the antenna region, and a second surface above the first surface. The first surface is substantially non-perpendicular to the second surface. The electronic device also includes a shielding element on the first surface and separated from the antenna region.

Embodiments of the present disclosure provide an electronic device. The electronic device includes a carrier having an antenna region disposed adjacent to a first surface of the carrier and a non-antenna region disposed adjacent to a second surface of the carrier. The electronic device also includes an element configured to provide an EMI shielding for the non-radiating region. The element and the antenna region are non-overlapping in a perspective of a first direction substantially parallel to the second surface of the carrier.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 2A-2, FIG. 2B-2, FIG. 2C-2, FIG. 2D-2, FIG. 2E-2, FIG. 2F-2, FIG. 2G-2, and FIG. 2H-2 illustrate cross-sectional views in one or more stages of a method of manufacturing an electronic device in accordance with an embodiment of the present disclosure.

FIG. 3A, FIG. 3B-1, FIG. 3C, FIG. 3D, and FIG. 3E illustrate perspective views in one or more stages of a method of manufacturing an electronic device in accordance with an embodiment of the present disclosure.

FIG. 3B-2 illustrate a cross-sectional view in one or more stages of a method of manufacturing an electronic device in accordance with an embodiment of the present disclosure.

DETAILED DESCRIPTION

Figure 1A:
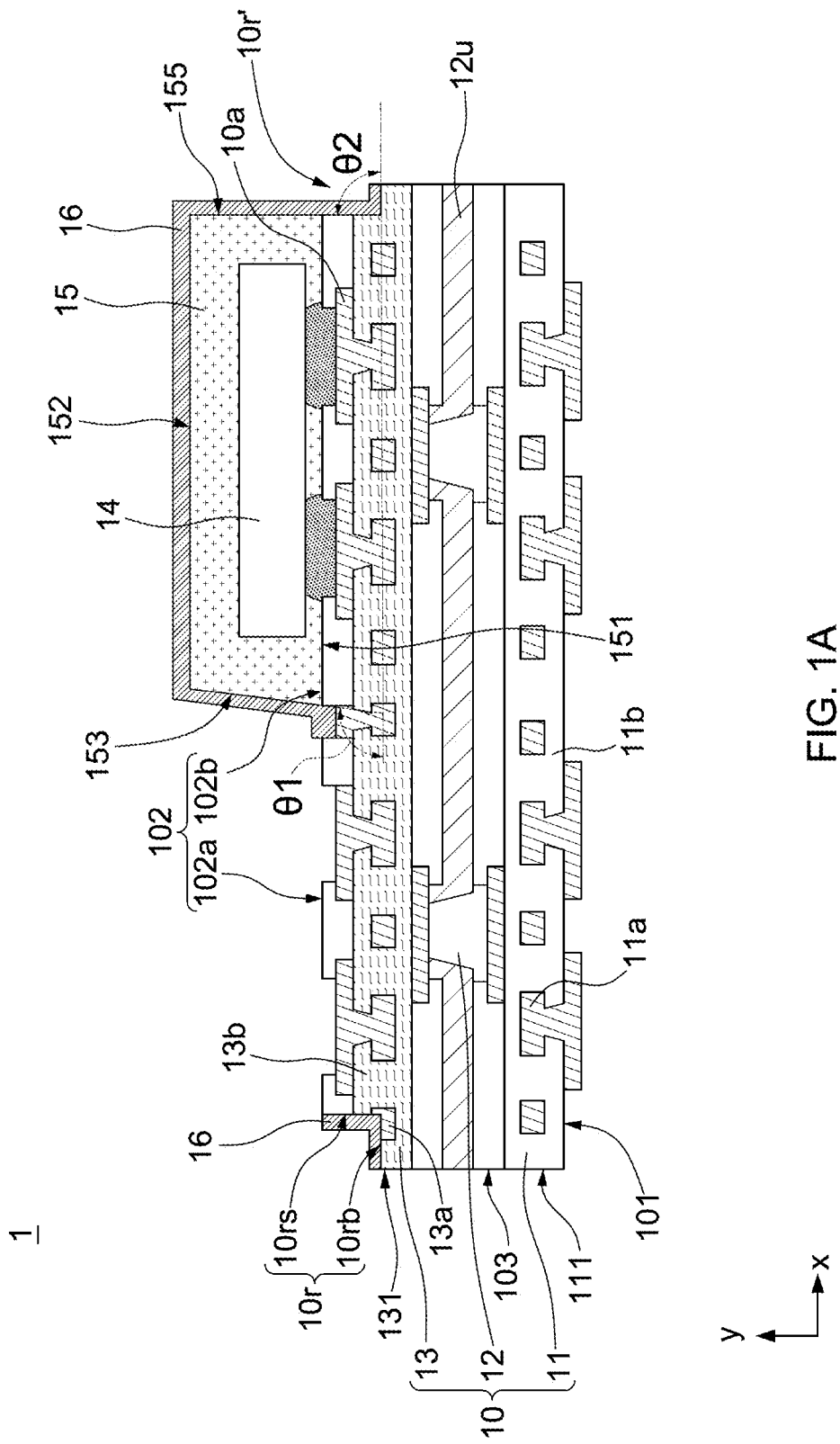
FIG. 1A is a cross-sectional view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figures 1, 2A:
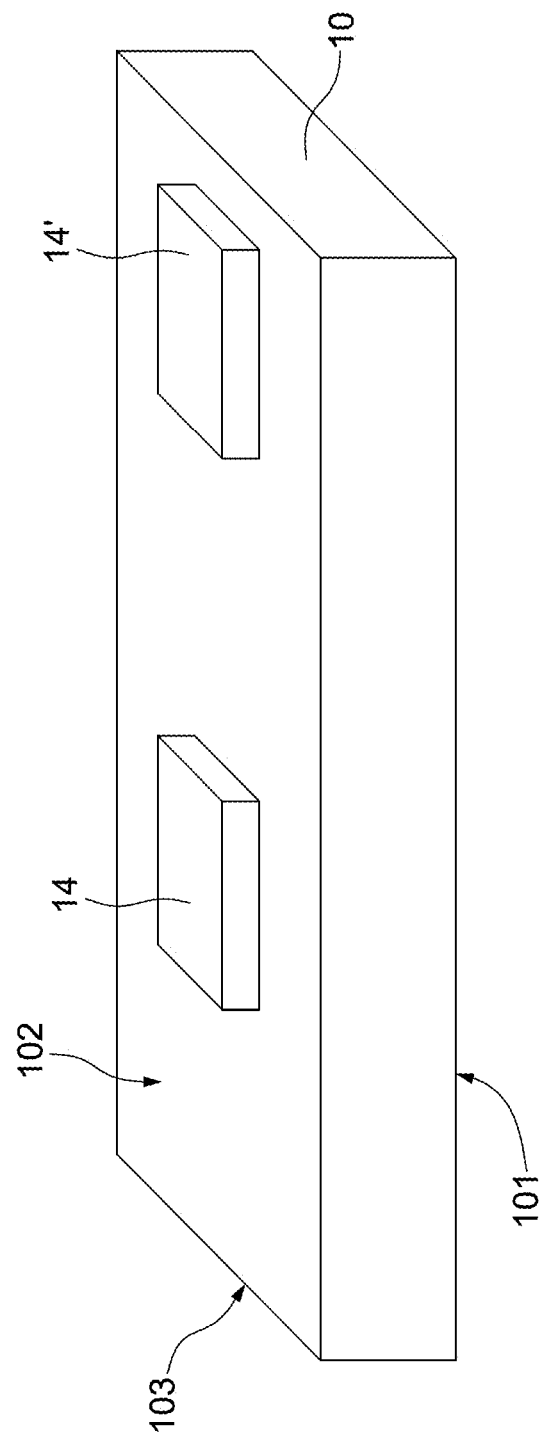
FIG. 2A-1, FIG. 2B-1, FIG. 2C-1, FIG. 2D-1, FIG. 2E-1, FIG. 2F-1, FIG. 2G-1, and FIG. 2H-1 illustrate perspective views in one or more stages of a method of manufacturing an electronic device in accordance with an embodiment of the present disclosure.

FIG. 1A is a cross-sectional view of an electronic device 1, in accordance with an embodiment of the present disclosure. Referring to FIG. 1, the electronic device 1 includes a carrier 10, an electronic component 14, an encapsulant 15, and an element 16.

In some embodiments, the electronic device 1 may be or include, for example, an antenna device or an antenna package. In some embodiments, the electronic device 1 may be or include, for example, a wireless device, such as an user equipment (UE), a mobile station, a mobile device, an apparatus communicating with the Internet of Things (IoT), etc.

In some embodiments, the carrier 10 (or a supporting element) may be or include, for example, a substrate. In some embodiments, the carrier 10 may be or include, for example, a printed circuit board, such as a paper-based copper foil laminate, a composite copper foil laminate, or a polymer-impregnated glass-fiber-based copper foil laminate.

The carrier 10 may have a surface 101, a surface 102 opposite to the surface 101, and a surface 103 extending between the surface 101 and the surface 102. In some embodiments, the surface 101 and/or the surface 102 may be substantially parallel to a first direction or a first orientation (such as an x-axis as shown in FIG. 1A). In some embodiments, the surface 101 and/or the surface 102 may be substantially perpendicular to a second direction or a second orientation (such as a y-axis as shown in FIG. 1A). In some embodiments, the surface 103 may be substantially parallel to the second direction (e.g., the y-axis).

In some embodiments, the carrier 10 may include conductive pad(s), trace(s), via(s), or other interconnection(s). For example, the carrier 10 may include one or more transmission lines (e.g., communications cables) and one or more grounding lines and/or grounding planes. For example, the carrier 10 may include one or more conductive pads 10a in proximity to, adjacent to, or embedded in and exposed at the surface 101 and/or the surface 102 of the carrier 10. The carrier 10 may include a solder resist (such as at regions 102a and 102b of the surface 102) on the surface 101 and/or the surface 102 to fully expose or to expose at least a portion of the conductive pads 10a for electrical connections.

In some embodiments, the carrier 10 may include recesses (or openings) 10r and 10r'. In some embodiments, the recess 10r may be recessed from the surface 102 to the surface 101. In some embodiments, the recess 10r may be recessed from the surface 103 into the carrier 10.

In some embodiments, the recess 10r may include a ladder or a stepped structure at a periphery of the carrier 10. For example, the recess 10r may be adjacent to the surface 103. For example, the recess 10r may include a sidewall 10rs angled with or non-parallel to the surface 102 and a bottom surface 10rb angled with or non-parallel to the sidewall 10rs. The sidewall 10rs may connect the surface 102 and the bottom surface 10rb. The bottom surface 10rb may connect the sidewall 10rs and the surface 103. In some embodiments, the bottom surface 10rb may be substantially parallel to the surface 102. However, in some other embodiments, the bottom surface 10rb may be non-parallel to the surface 102.

In some embodiments, the recess 10r' may be recessed from the surface 102 to the surface 101. In some embodiments, the recess 10r' may be recessed from the surface 103 into the carrier 10. The recess 10r' may have the same or similar configuration as the recess 10r and the same or similar details of the recess 10r' are not repeated here for conciseness. In some embodiments, the encapsulant 15 and the carrier 10 may define a ladder or a stepped structure.

In some embodiments, the carrier 10 may include a radiating region 11 and a non-radiating region 13. In some embodiments, the radiating region 11 may be spaced apart from the non-radiating region 13. In some embodiments, the radiating region 11 may be disposed adjacent to the surface 101 of the carrier 10 and the non-radiating region 13 may be disposed adjacent to the surface 102 of the carrier 10. In some embodiments, the radiating region 11 may be referred to as a region configured for signal transmission and reception and the non-radiating region 13 may be referred to as a region configured to route, signal, power, ground, clock, or the like.

In some embodiments, for enhancing antenna performance, a dimension (such as a thickness) of the radiating region 11 measured along the first direction (such as the x-axis as shown in FIG. 1A) may be greater than a dimension (such as a thickness) of the non-radiating region 13 measured along the first direction. In some embodiments, the radiating region 11 may have a thickness greater than about 70 micrometers ($\mu m$), such as about 700 $\mu m$ or more. In some embodiments, the non-radiating region 13 may have a thickness between about 30 $\mu m$ and about 60 $\mu m$.

In some embodiments, the radiating region 11 and the non-radiating region 13 may be electrically connected through, for example, a conductive element 12. In some embodiments, the radiating region 11 may be physically spaced apart from the non-radiating region 13 through the conductive element 12. For example, the conductive element 12 may be disposed between the radiating region 11 and the radiating region 13.

In some embodiments, the radiating region 11 may be or include, for example, an antenna layer. For example, the radiating region 11 may include one or more conductive layers 11a and one or more dielectric layers 11b. In some embodiments, the conductive layers 11a may be embedded in the radiating region 11. In some embodiments, a part of the conductive layers 11a may be covered by the dielectric layers 11b while another part of the conductive layers 11a may be exposed from the dielectric layers 11b. For example, the conductive layers 11a may be exposed from the surface 101. In some embodiments, the conductive layer 11a may define a patterned antenna, such as a directional antenna, an omnidirectional antenna, an antenna array. For example, the conductive layer 11a may define a patch antenna. In some embodiments, the conductive layer 11a may be or include one or more light emitting devices or sensors. In some embodiments, the conductive layer 11a may support fifth generation (5G) and/or millimeter (mm) wave communications. For example, the conductive layer 11a may be configured for transmission and reception using millimeter wave signals. In some embodiments, the conductive layer 11a may be operated at 27.5-29.5 GHz.

In some embodiments, the conductive layer 11a may include, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some embodiments, the dielectric layer 11b may include pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of a pre-preg may include, but are not limited to, a multi-layer structure formed by stacking or laminating a number of pre-impregnated materials/sheets. In some embodiments, the radiating region 11 (such as the dielectric layer 11b) may include liquid crystal polymers (LCPs).

In some embodiments, the non-radiating region 13 may be or include, for example, a circuit layer or a building-up circuit. For example, the non-radiating region 13 may include one or more conductive layers and one or more dielectric layers 13b. The conductive layers may include routing traces to route, signal, power, ground, clock, or the like. For example, a grounding layer 13a may be disposed in the dielectric layers 13b. A part of the grounding layer 13a may be covered by the dielectric layers 13b while another part of the grounding layer 13a may be exposed from the dielectric layers 13b.

For example, a part of the grounding layer 13a may be exposed from the recess 10r. For example, a part of the grounding layer 13a may be exposed from the bottom surface 10rb and/or the sidewall 10rs. In some other embodiments, more grounding layers 13a may be exposed from the recess 10r. For example, two, three, four, or more grounding layers 13a may be exposed from the recess 10r. The multiple grounding layers 13a may be at least partially overlapped along the second direction (e.g., the y-axis). In some embodiments, a dielectric constant (Dk) of the non-radiating region 13 (such as the dielectric layers 13b) may be greater than a Dk of the radiating region 11 (such as the dielectric layers 11b).

In some embodiments, the conductive element 12 may include a controlled collapse chip connection (C4) bump, a ball grid array (BGA) or a land grid array (LGA). In some embodiments, a connection layer 12u may be disposed between the radiating region 11 and the non-radiating region 13 to cover the conductive element 12. In some embodiments, the connection layer 12u may include an underfill or an adhesive layer. However, in other embodiments, the connection layer 12u may be omitted. In some embodiments, a dielectric constant (Dk) of the connection layer 12u may be equal to or less than 13, such as between about 11 and about 13. In some embodiments, the connection layer 12u may include a soldering material, such as solder or conductive paste.

In some embodiments, the conductive element 12 may be considered as a portion of the radiating region 11 or a portion of the non-radiating region 13. For example, the conductive element 12 may be a conductive terminal of the radiating region 11 and at least partially exposed from the dielectric layer 11b. Alternatively, the conductive element 12 may be a conductive terminal of the non-radiating region 13 and at least partially exposed from the dielectric layer 13b.

In some embodiments, the electronic component 14 may be disposed on the surface 102 of the carrier 10. The electronic component 14 may be electrically connected to one or more other electrical components (if any) and to the carrier 10 (e.g., to the interconnection(s)), and the electrical connection may be attained by way of flip-chip, wire-bond techniques, metal to metal bonding (such as Cu to Cu bonding), or hybrid bonding.

In some embodiments, the electronic component 14 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof. In some embodiments, the electronic component 14 may be integrated circuit (IC) dies, radio frequency ICs (RFICs), power management ICs (PMICs), surface mount devices (SMDs), etc.

In some embodiments, the encapsulant 15 may be formed on the surface 102 of the carrier 10 to encapsulate the electronic component 14. In some embodiments, the encapsulant 15 may include a surface 151 facing the carrier 10, a top surface 152 opposite to the surface 151, and multiple lateral surfaces (such as the lateral surfaces 153 and 155) extending between the surface 151 and the top surface 152. The lateral surface 155 may be opposite to the lateral surface 153 from a cross-sectional perspective.

In some embodiments, the surface 102 of the carrier 10 may include the region 102a and the region 102b connected with the region 102b. The region 102b of the surface 102 may be covered or overlapped with the electronic component 14 and the encapsulant 15 in the second direction (e.g., the y-axis). The region 102a of the surface 102 may be spaced apart from (or non-overlapping with) the electronic component 14 and the encapsulant 15 in the second direction (e.g., the y-axis). In some embodiments, the region 102a may include a dielectric material, such as a solder resist.

The lateral surface 153 of the encapsulant 15 may face the region 102a of the surface 102. For example, from a cross-sectional perspective, the lateral surface 153 may be closer to the region 102a than the lateral surface 155.

In some embodiments, a slope of the lateral surface 153 of the encapsulant 15 and a slope of the lateral surface 155 of the encapsulant 15 may be different. In some embodiments, the lateral surface 153 of the encapsulant 15 may define an angle "θ1" with the surface 102 of the substrate 10 and the lateral surface 155 of the encapsulant 15 may define an angle "θ2" with the surface 102 of the substrate 10. In some embodiments, the angle θ1 and the angle θ2 may be different. For example, the angle θ1 may be greater than the angle θ2. For example, the angle θ1 may be substantially greater than about 90 degrees, and the angle θ2 may be substantially equal to about 90 degrees.

In some embodiments, a roughness of the lateral surface 153 of the encapsulant 15 and a roughness of the lateral surface 155 of the encapsulant 15 may be different. For example, a roughness of the lateral surface 153 of the encapsulant 15 may be substantially greater than a roughness of the lateral surface 155 of the encapsulant 15.

Figures 2, 2A:
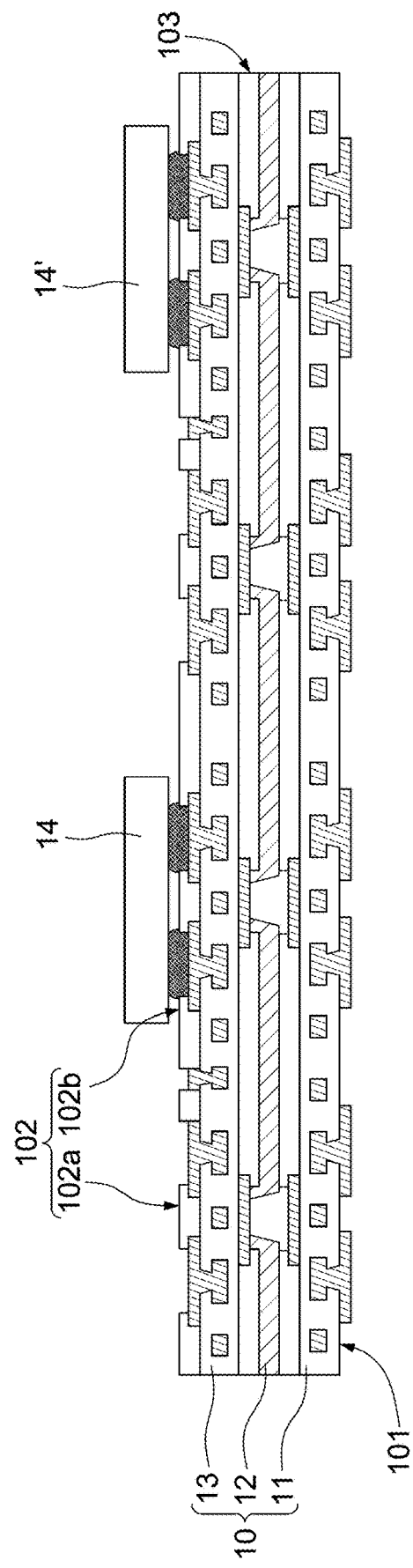
Figures 1, 2B:
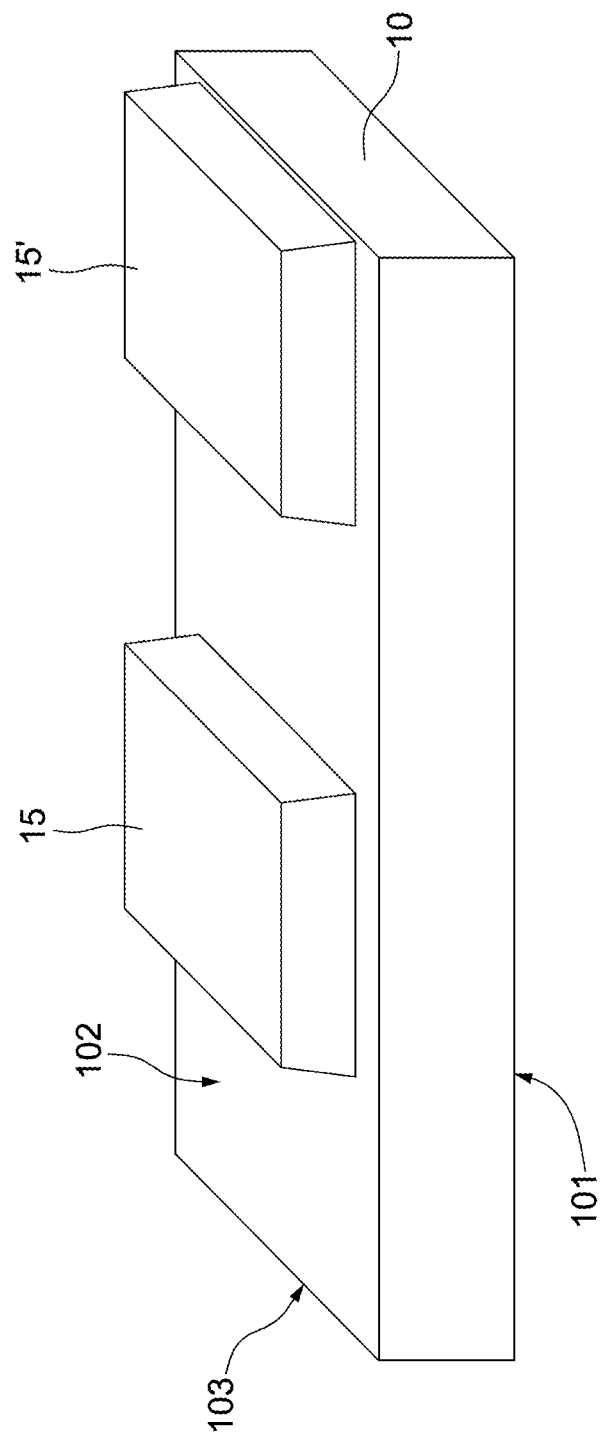
Figures 2, 2B:
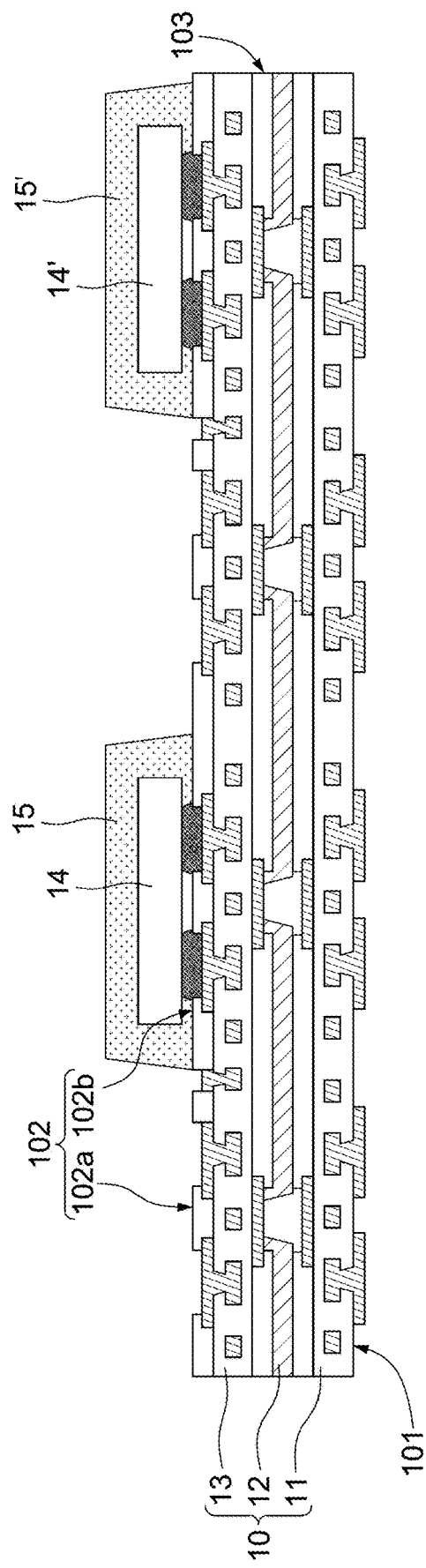
Figures 1, 2C:
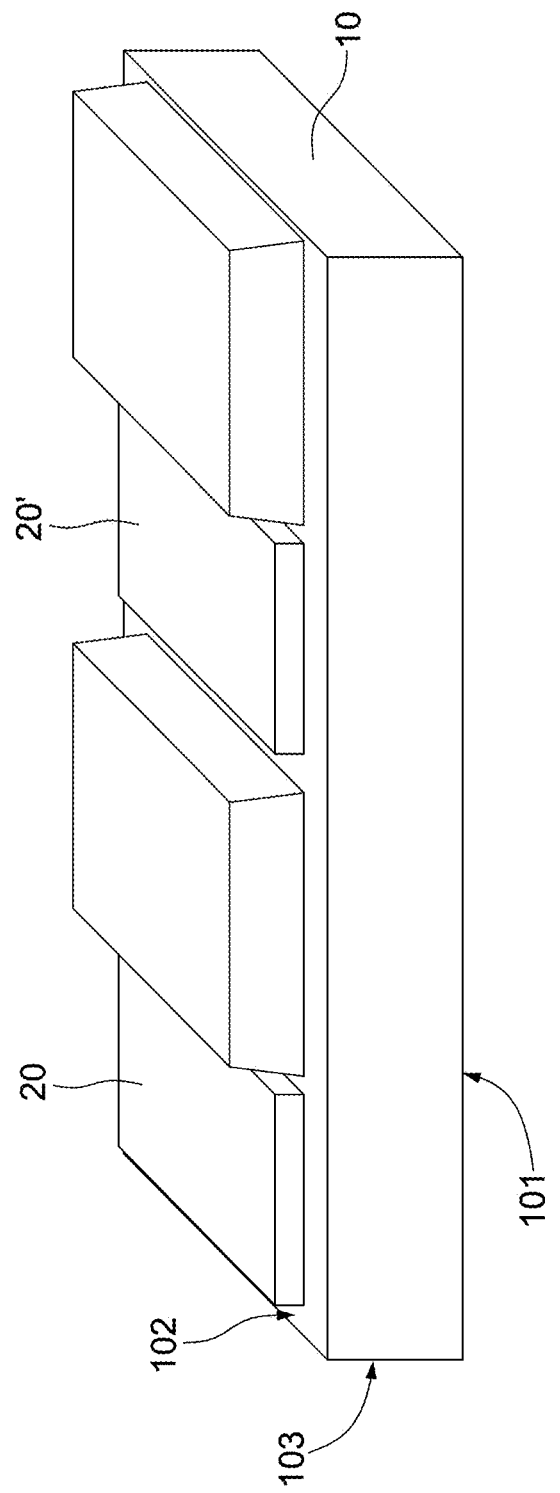
Figures 2, 2C:
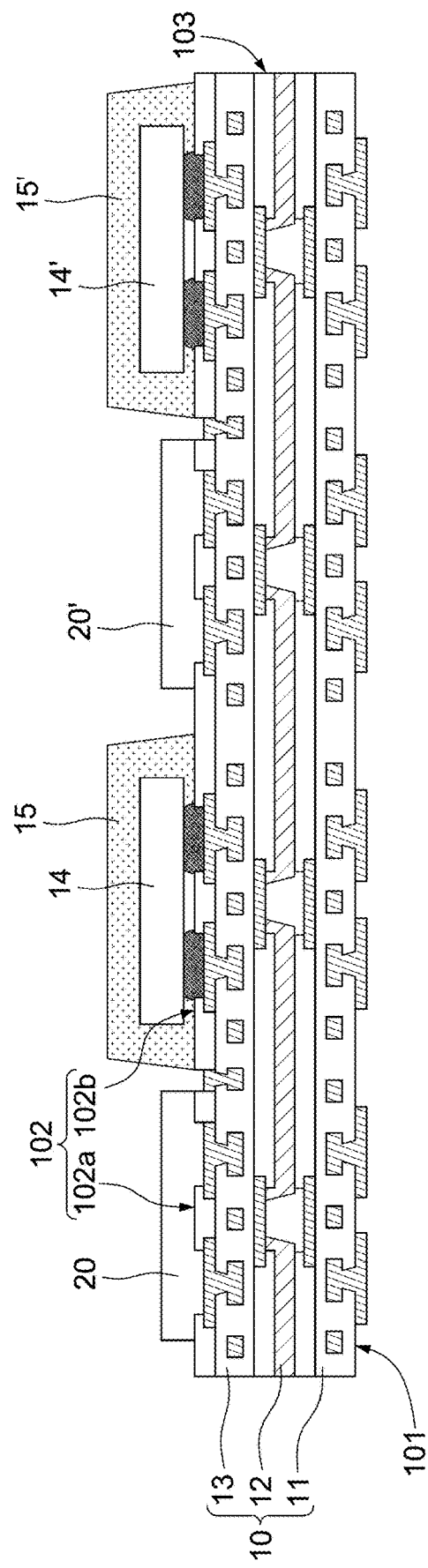
Figures 1, 2D:
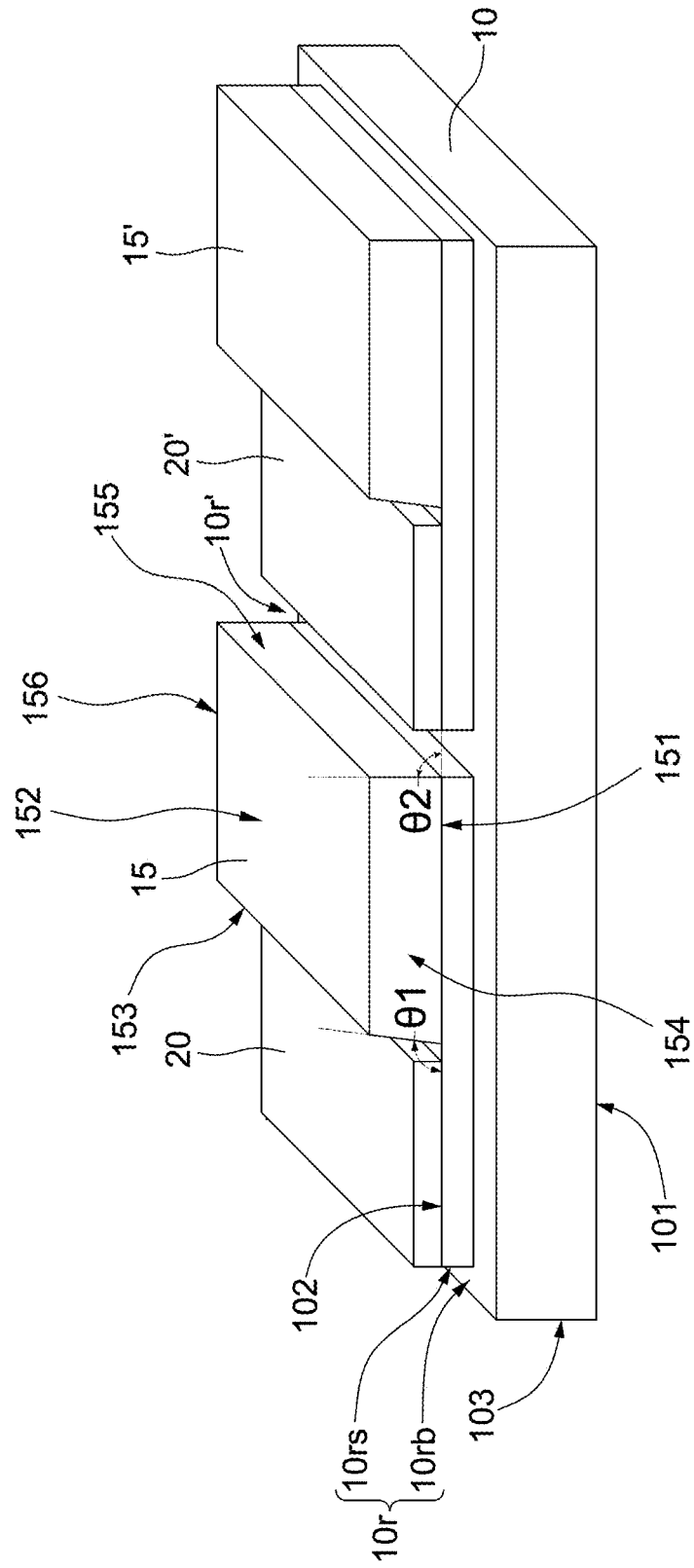
Figures 2, 2D:
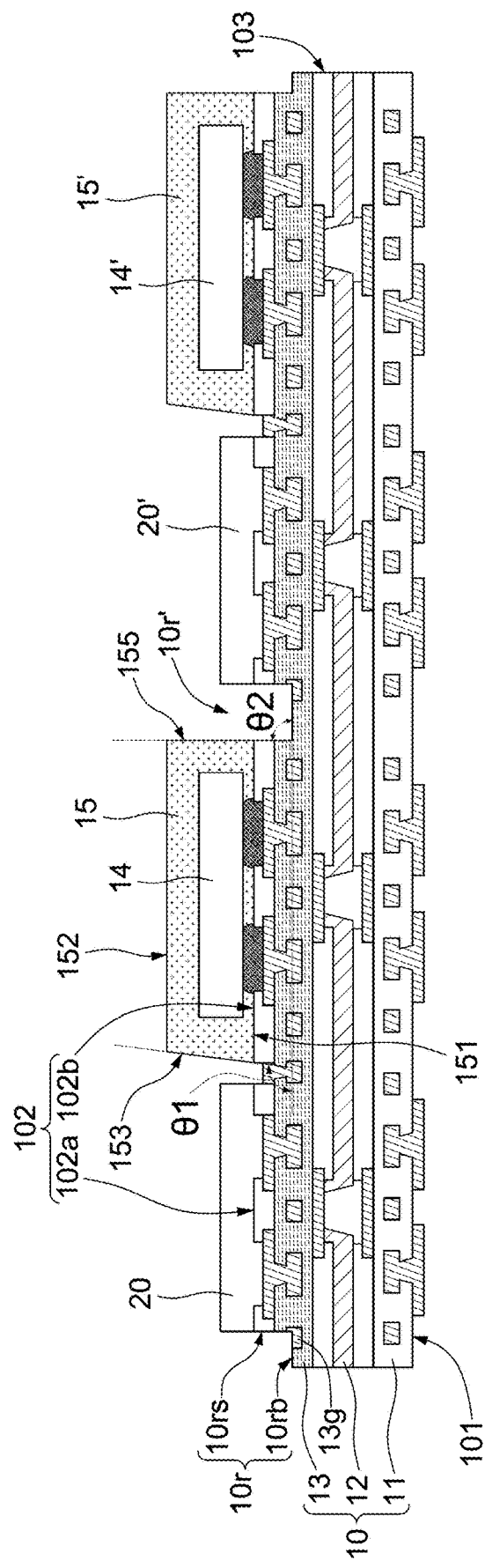

During a manufacturing process of the electronic device 1 according to some embodiments of the present disclosure, the lateral surface 155 of the encapsulant 15 is cut or sawed substantially along the second direction (e.g., the y-axis) while the lateral surface 153 of the encapsulant 15 is not (such as shown in FIG. 2D-1 and FIG. 2D-2). After the cutting or sawing operation, the slopes of the lateral surface 153 and the lateral surface 155 may be different. In addition, the roughness values of the lateral surface 153 and the lateral surface 155 may be different.

In some embodiments, the lateral surface 155 of the encapsulant 15 may be substantially coplanar with the sidewall (not labelled in the figures) of the recess 10rs'.

In some embodiments, the encapsulant 15 may include an epoxy resin having fillers, a molding compound (e.g., an epoxy molding compound or other molding compound), a polyimide, a phenolic compound or material, a material with a silicone dispersed therein, or a combination thereof.

In some embodiments, the element 16 may be configured to provide an electromagnetic interference (EMI) shielding protection for the non-radiating region 13 of the carrier 10. For example, the element 16 may be configured to provide an EMI shielding to prevent the electronic component 14 from being interfered with by other electronic components, and vice versa. In some embodiments, the element 16 may be configured to allow a gain of the radiating region 11 to be greater than 20 dB.

Figures 1, 2E:
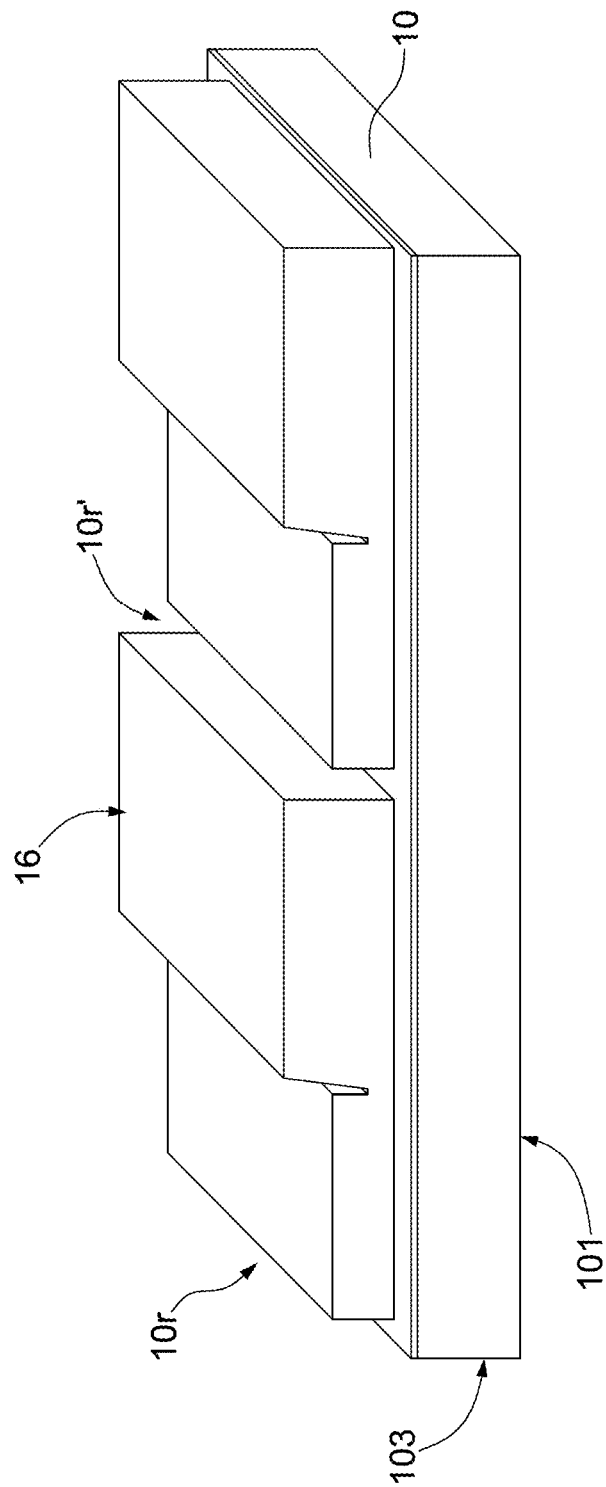
Figures 2, 2E:
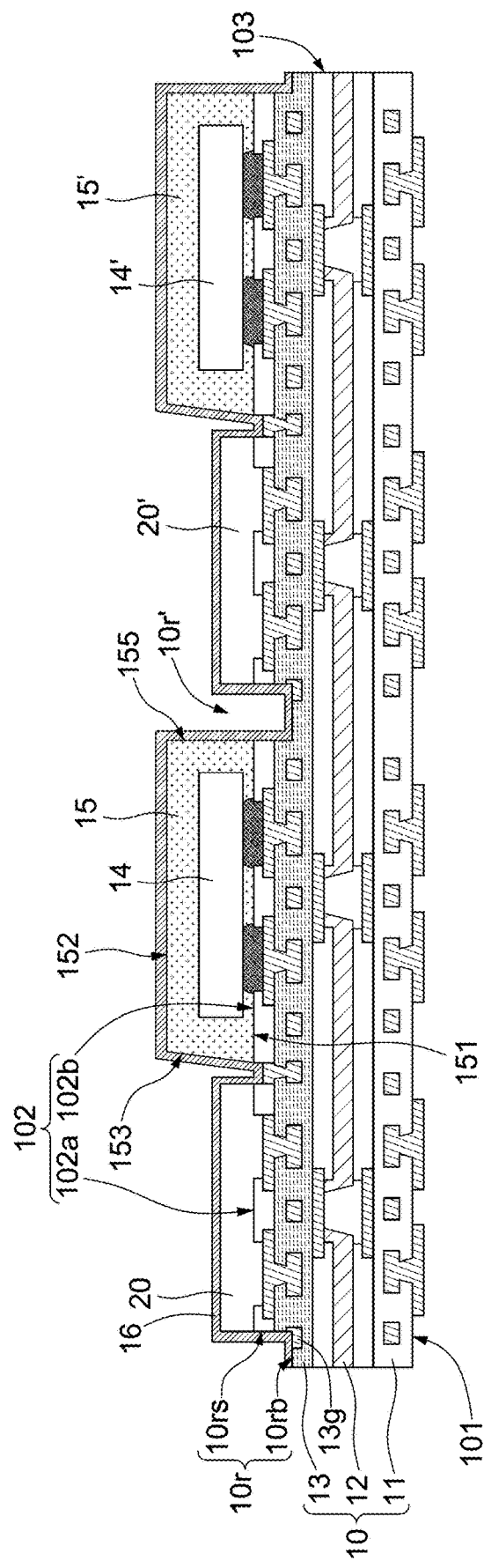

In some embodiments, the element 16 may include copper (Cu) or other conductive materials, such as aluminum (Al), chromium (Cr), tin (Sn), gold (Au), silver (Ag), nickel (Ni) or stainless steel, another metal, or a mixture, an alloy, or other combinations of two or more thereof. In some embodiments, the element 16 may be or include a conductive layer or a conductive thin film. In some embodiments, the element 16 may be implemented using a conformal molding with a sputtered shield (such as shown in FIG. 2E-1 and FIG. 2E-2). In some embodiments, the element 16 may be or include a multi-layered structure. For example, layers of the element 16 from the inside to the outside may include a seed layer (such as porous stainless steel, SUS), a conductive layer (such as Cu), and a protection layer (such as SUS).

In some embodiments, the element 16 may be disposed on the surface 102 of the carrier 10 and physically spaced apart from the surface 101 of the carrier 10. For example, the element 16 may be disposed on the non-radiating region 13 and physically spaced apart from the radiating region 11. For example, the element 16 may be physically spaced apart from the radiating region 11 through the non-radiating region 13. For example, the element 16 may be physically spaced apart from the conductive layer 11a (e.g., the antenna layer) in the radiating region 11. For example, the element 16 may not contact the conductive layer 11a (e.g., the antenna layer) in the radiating region 11.

In some embodiments, the surface 102 of the carrier 10 may be partially covered by or overlapped with the element 16 in the second direction (e.g., the y-axis). For example, the element 16 may be disposed on the region 102b of the surface 102 of the carrier 10. For example, the region 102b of the surface 102 of the carrier 10 may be at least partially covered by or overlapped with the element 16. On the other hand, the region 102a of the surface 102 of the carrier 10 may be at least partially exposed from the element 16.

Specifically, for example, the element 16 may be disposed on the encapsulant 15. For example, the element 16 may be disposed on the external surfaces (e.g., the top surface 152 and the lateral surfaces including the lateral surfaces 153 and 155) of the encapsulant 15.

In some embodiments, the element 16 may be disposed within the recess 10r. For example, the element 16 may be disposed on and contact the bottom surface 10rb and/or the sidewall 10rs of the recess 10r.

In some embodiments, the element 16 may contact the grounding layer 13a. For example, the element 16 may contact a part of the grounding layer 13a exposed from the bottom surface 10rb and/or the sidewall 10rs. For example, the element 16 may be electrically connected with the grounding layer 13a and thus be grounded.

Similarly, the element 16 may be disposed within the recess 10r'. In some embodiments, the element 16 may be disposed on a planar surface defined by the lateral surface 155 of the encapsulant 15 and the sidewall (not labelled in the figures) of the recess 10rs'.

In some embodiments, the surface 103 of the substrate 10 may be at least partially exposed from the element 16. For example, the surface 103 of the substrate 10 may include a lateral surface 131 of the non-radiating region 13 and a lateral surface 111 of the radiating region 11.

The recess 10r may be recessed from the lateral surface 131 of the non-radiating region 13 into the radiating region 13. Therefore, the element 16 may be overlapping with the sidewall 10rs of the recess 10r and be non-overlapping with the surface 131 of the non-radiating region 13 in the first direction (e.g., the x-axis). In addition, the element 16 may be overlapping with the bottom surface 10rb of the recess 10r in the second direction (e.g., the y-axis).

In some embodiments, the lateral surface 111 of the radiating region 11 may be at least partially exposed from the element 16. In some embodiments, the lateral surface 111 of the radiating region 11 may be entirely exposed from the element 16. For example, the element 16 and the lateral surface 111 of the radiating region 11 may be non-overlapping in the first direction (e.g., the x-axis). For example, the element 16 and the conductive layer 11a (e.g., the antenna layer) in the radiating region 11 may be non-overlapping in the first direction (e.g., the x-axis). In some embodiments, the signal transmission and reception of the conductive layer 11a (e.g., the antenna layer) in the radiating region 11 may not be blocked or interrupted by the element 16.

In some embodiments, the element 16 and the radiating region 11 may be at least partially overlapping in the second direction (e.g., the y-axis). For example, the element 16 and the conductive layer 11a (e.g., the antenna layer) in the radiating region 11 may be at least partially overlapping in the second direction (e.g., the y-axis).

In some embodiments, the conductive element 12 may be at least partially exposed from the element 16. In some embodiments, the conductive element 12 may be entirely exposed from the element 16. For example, the element 16 and the conductive element 12 may be non-overlapping in the first direction (e.g., the x-axis). In some embodiments, the element 16 and conductive element 12 may be at least partially overlapping in the second direction (e.g., the y-axis).

Figure 1B:
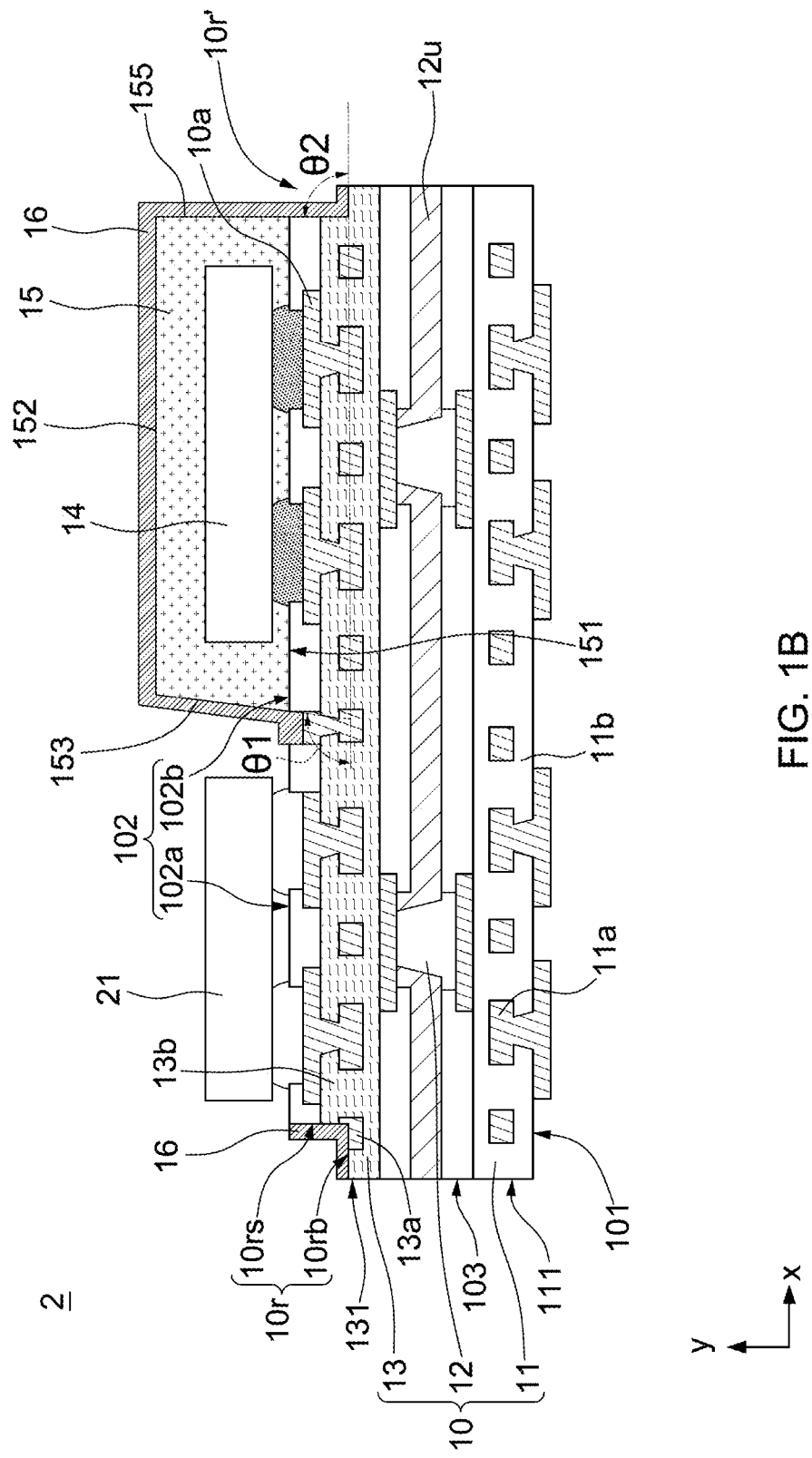
FIG. 1B is a cross-sectional view of an electronic device, in accordance with an embodiment of the present disclosure.

FIG. 1B is a cross-sectional view of an electronic device 2, in accordance with an embodiment of the present disclosure. The electronic device 2 is similar to the electronic device 2 as shown in FIG. 1A, and the differences therebetween are described below.

Referring to FIG. 1B, the electronic device 2 further includes an electronic component 21 disposed on the region 102a of the surface 102 and can provide electrical connections between the electronic device 2 and external components (e.g., external circuits or circuit boards). In some embodiments, the electronic component 21 may be exposed from the element 16. In some embodiments, the electronic component 21 may include a connector, such as a board-to-board connector or a connector for HotBar soldering.

Figure 1C:
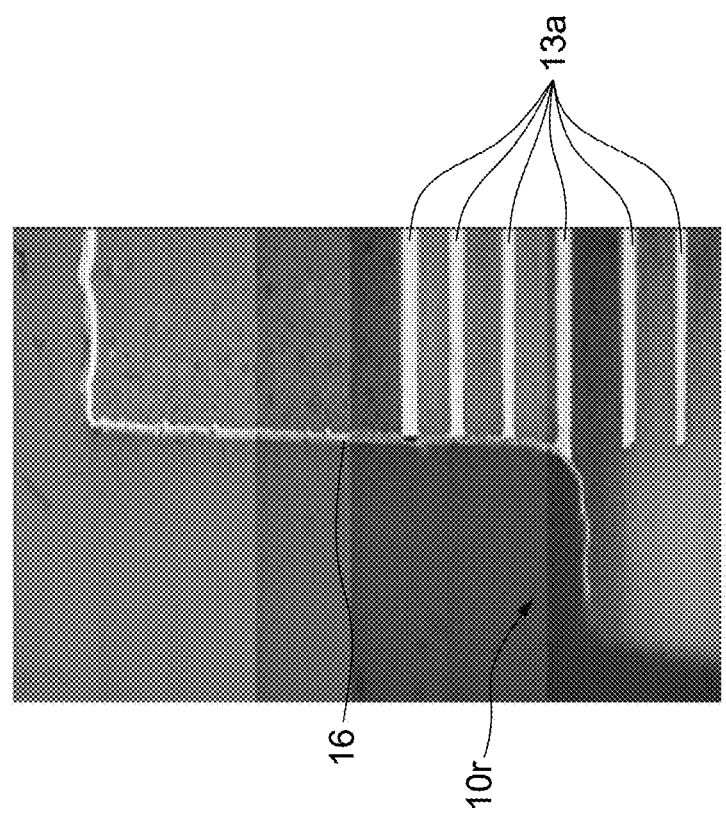
FIG. 1C is a cross-sectional view of a part of an electronic device, in accordance with an embodiment of the present disclosure.

FIG. 1C is a cross-sectional view of a part of an electronic device, in accordance with an embodiment of the present disclosure. In some embodiments, the electronic device 1 and/or the electronic device 2 may include a structure shown in FIG. 1C. For example, the grounding layer 13a may be partially exposed from the recess 10r. The element 16 may be in contact with the grounding layer 13a.

FIG. 2A-1, FIG. 2B-1, FIG. 2C-1, FIG. 2D-1, FIG. 2E-1, FIG. 2F-1, FIG. 2G-1, and FIG. 2H-1 illustrate perspective views in one or more stages of a method of manufacturing an electronic device in accordance with an embodiment of the present disclosure. FIG. 2A-2, FIG. 2B-2, FIG. 2C-2, FIG. 2D-2, FIG. 2E-2, FIG. 2F-2, FIG. 2G-2, and FIG. 2H-2 illustrate cross-sectional views of the perspective views in FIG. 2A-1, FIG. 2B-1, FIG. 2C-1, FIG. 2D-1, FIG. 2E-1, FIG. 2F-1, FIG. 2G-1, and FIG. 2H-1, respectively. At least some of these figures have been simplified to better understand the aspects of the present disclosure. In some embodiments, the electronic device 1 and/or the electronic device 2 may be manufactured through the operations described with respect to FIG. 2A-1 through FIG. 2H-1 and FIG. 2A-2 through FIG. 2H-2.

Referring to FIG. 2A-1 and FIG. 2A-2, the carrier 10 is provided. The carrier 10 may include the radiating region 11 disposed adjacent to the surface 101, the non-radiating region 13 disposed adjacent to the surface 102, and the conductive element 12 connected between the radiating region 11 and the non-radiating region 13. The electronic component 14 (and another electronic component 14', if any) may be disposed on the surface 102 of the carrier 10. The surface 102 of the carrier 10 may include the region 102a and the region 102b connected with the region 102b. The electronic component 14 may be disposed on the region 102b.

In the present embodiment, the carrier 10 may include a copper clad laminate (CCL) substrate, which includes several carrier units that one may be separable from another by a scribe line (not shown). Since each of the carrier units is subjected to similar or identical processes in the manufacturing method, for convenience, only one exemplary carrier unit is detailed described as followings.

Referring to FIG. 2B-1 and FIG. 2B-2, the encapsulant 15 is formed on the surface 102 of the carrier 10 to cover or encapsulate the electronic component 14. Another encapsulant 15' may be formed on the surface 102 of the carrier 10 to cover or encapsulate the electronic component 14', if any. In some embodiments, the encapsulant 15 may be formed by a molding technique, such as transfer molding or compression molding.

Referring to FIG. 2C-1 and FIG. 2C-2, a protection layer 20 (and another protection layer 20', if any) may be disposed on the region 102a of the surface 102. In some embodiments, the protection layer 20 may protect the region 102a from being covered by the element 16 in the following operations. In some embodiments, the protection layer 20 may be or include, for example, a thermally stable tape, such as Polyimides (PI).

Referring to FIG. 2D-1 and FIG. 2D-2, a first cutting or sawing operation may be performed to form the recesses 10r and 10r'. The first cutting or sawing operation may be a half-cutting operation such that the radiating region 11 is not exposed from the recesses 10r and 10r'.

The first cutting or sawing operation may include cutting or sawing four sides of the carrier units. The recesses 10r and 10r' may be formed on four sides of the carrier units. After the first cutting or sawing operation, the encapsulant 15 may be partially removed. The lateral surfaces (including the lateral surfaces 154, 155, and 156) of the encapsulant 15 may define the angle θ2 with the surface 102 of the substrate 10. The angle θ2 may be substantially equal to about 90 degrees. The lateral surface 153 of the encapsulant 15 may not be cut or sawed and thus the slope and the angle θ1 thereof may be different from the slope and the angle θ2 of the lateral surfaces 154, 155, and 156. In addition, the roughness value of the lateral surface 153 may be substantially greater than the roughness values of the lateral surfaces 154, 155, and 156.

A part of the non-radiating region 13 may be exposed from the recesses 10r and 10r'. For example, the grounding layer 13a of the non-radiating region 13 may be exposed from the bottom surface 10rb and/or the sidewall 10rs of the recess 10r.

Referring to FIG. 2E-1 and FIG. 2E-2, the element 16 may be disposed on the exposed surfaces of the encapsulant 15 and the protection layer 20. The element 16 may be disposed on the bottom surface 10rb and/or the sidewall 10rs of the recess 10r. The element 16 may contact the grounding layer 13a of the non-radiating region 13.

In some embodiments, the element 16 may be disposed through, for example, a physical vapor deposition (PVD), such as sputtering or spray coating. In some embodiments, the element 16 may be disposed through a chemical vapor deposition (CVD) or plating.

Figures 1, 2F:
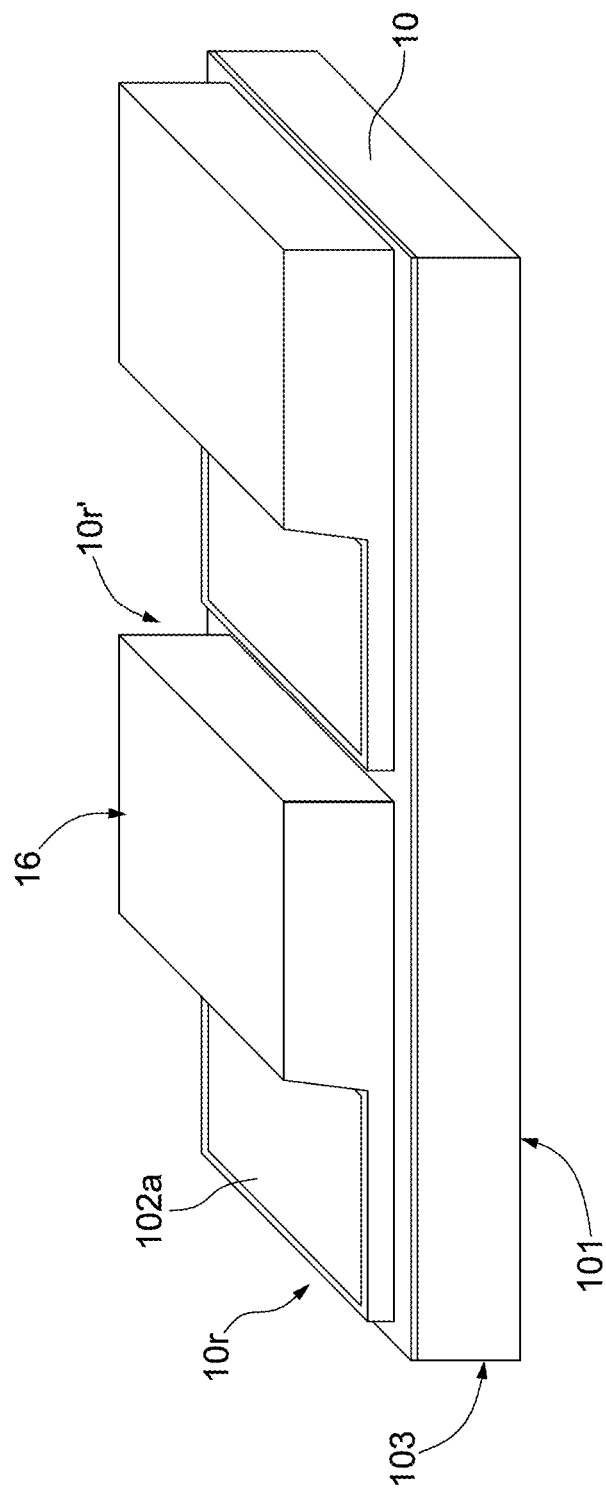
Figures 2, 2F:
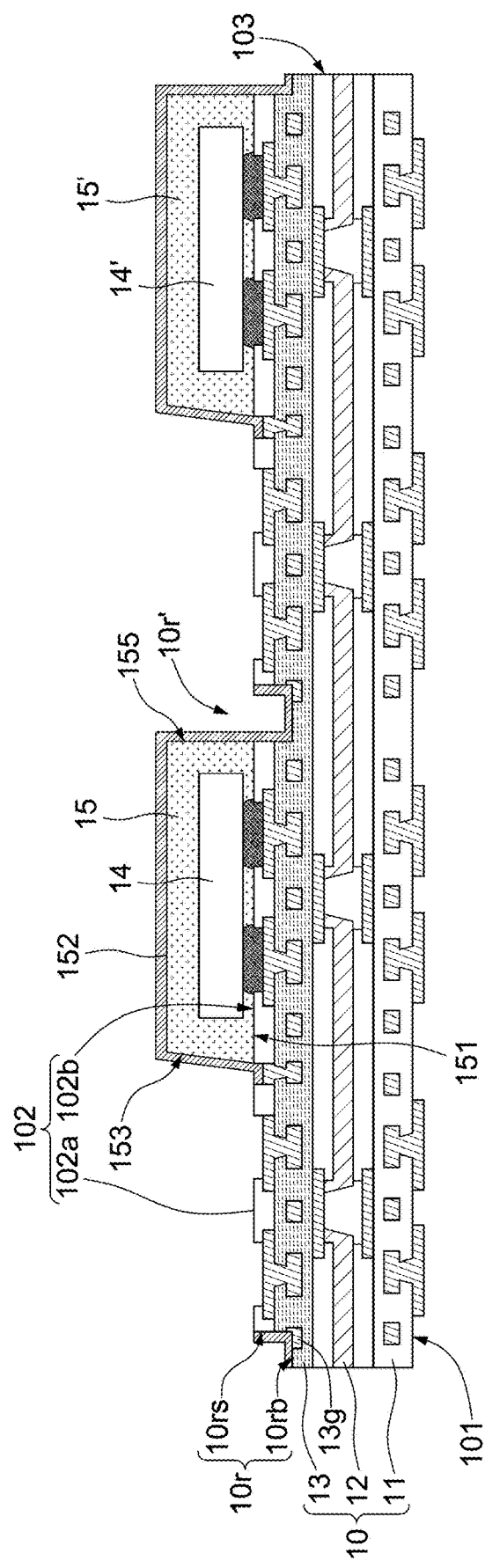

Referring to FIG. 2F-1 and FIG. 2F-2, the protection layer 20 (and the protection layer 20', if any) may be removed from the region 102a of the surface 102.

Figures 1, 2G:
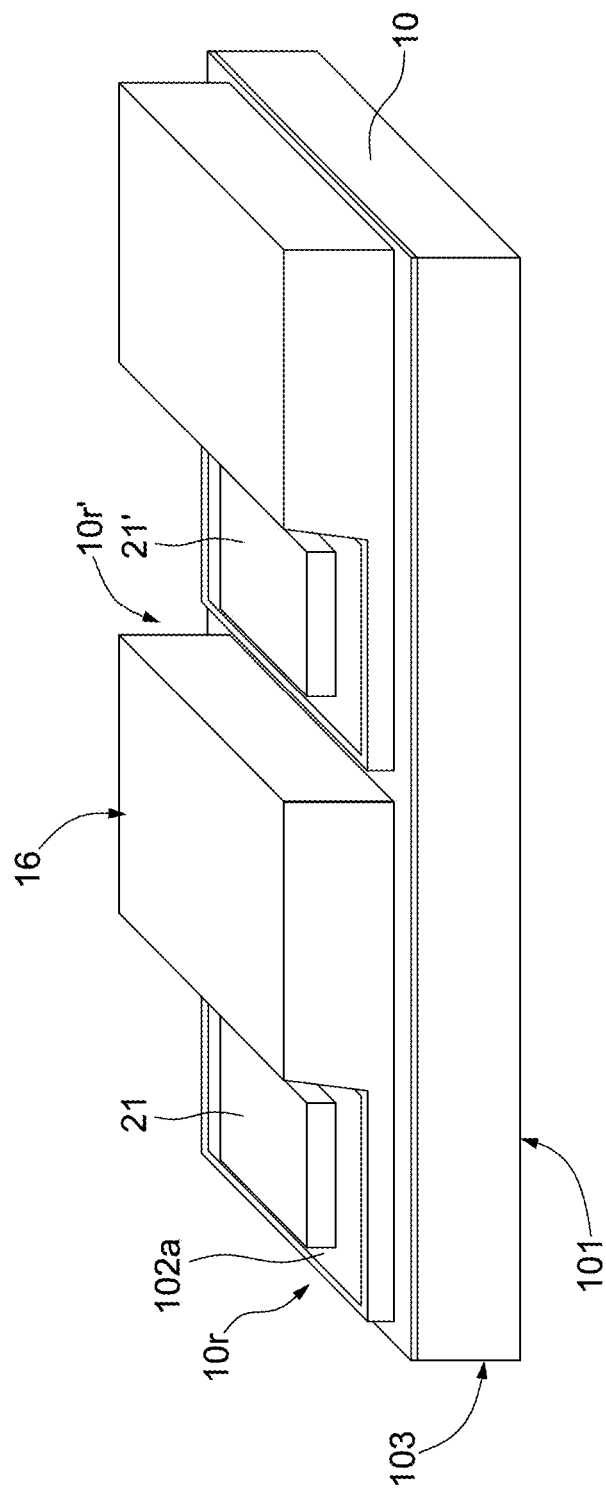
Figures 2, 2G:
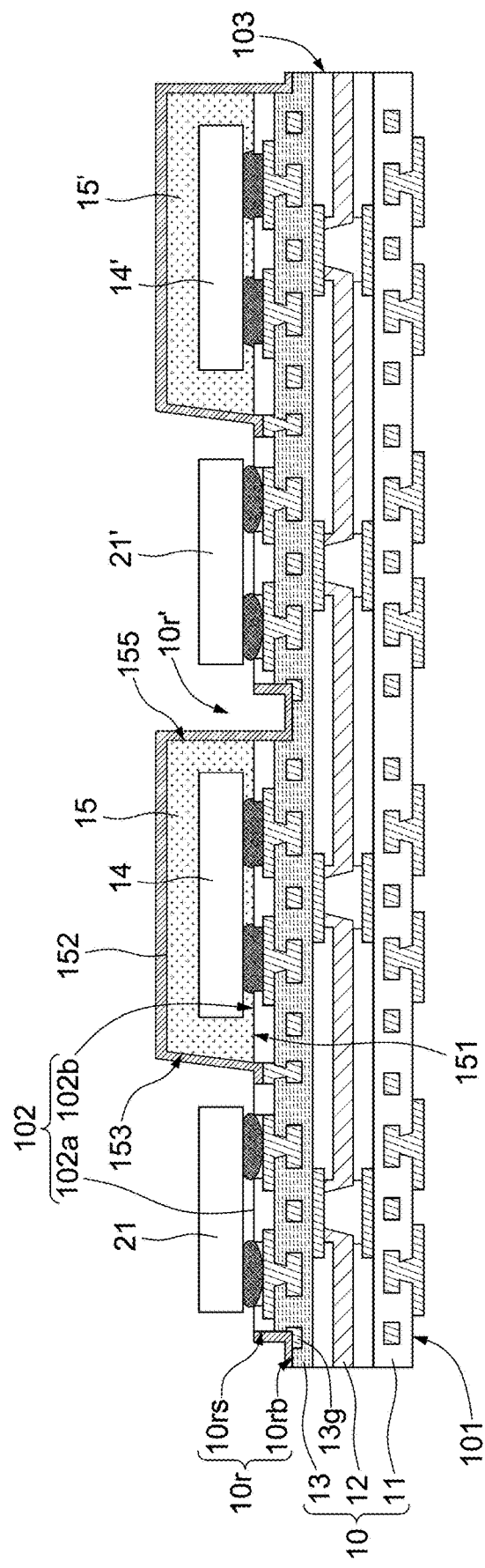

Referring to FIG. 2G-1 and FIG. 2G-2, an electronic component 21 (and another electronic component 21', if any) may be disposed on the region 102a of the surface 102 to provide electrical connections with external components.

Figures 1, 2H:
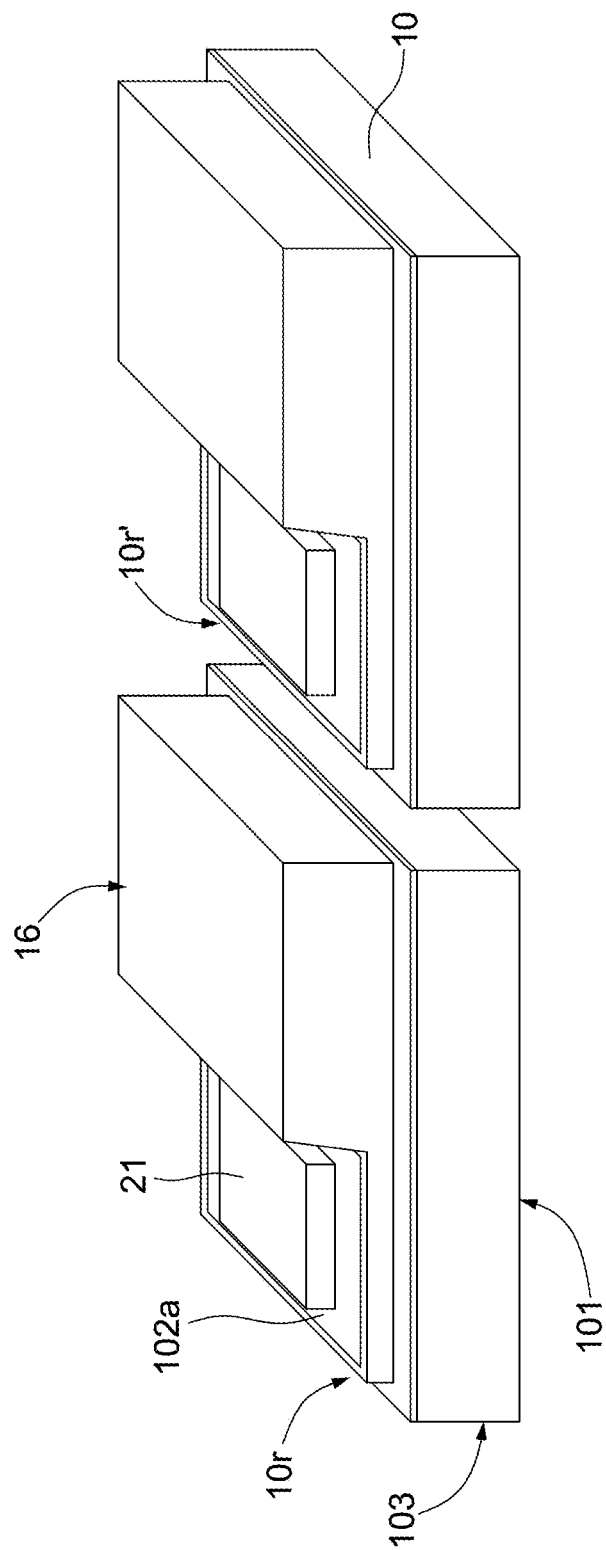
Figures 2, 2H:
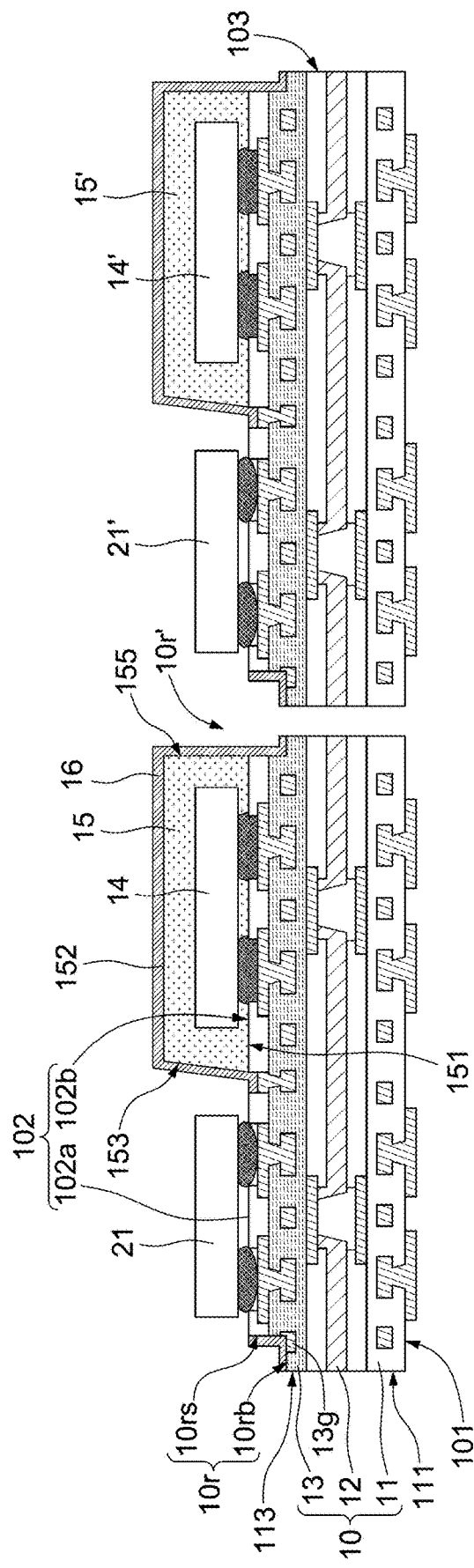

Referring to FIG. 2H-1 and FIG. 2H-2, a second cutting or sawing operation may be performed to separate the carrier 10 into several carrier units. The second cutting or sawing operation may be a full-cutting operation to fully penetrate the carrier 10.

After the second cutting or sawing operation, a part (such as the surface 131) of the non-radiating region 13 may be exposed and a part (such as the surface 111) of the radiating region 11 may be exposed.

In some embodiments, a thickness of a saw blade used to perform the second cutting or sawing operation may be controlled so as not to damage the element 16.

In some existing approaches of forming an EMI shielding layer (such as the element 16), a thermally stable tape may be utilized to protect the antenna layer (such as the conductive layer 11a). For example, a thermally stable tape may be utilized to cover the surface 101 and a part of the surface 103 during the sputtering operation of the element 16.

However, the thermally stable tape may not be thick enough to control the sputtering depth, which may cause issues (such as overflow or burn marking). In addition, the antenna layer may laterally overlap or be covered by the EMI shielding layer, which may hinder the signal transmission and reception of the antenna layer.

In comparison, in the present disclosure, a first cutting or sawing operation is performed to form the recess 10r and to expose the grounding layer 13a. The conductive layer 11a is formed on the exposed surfaces. Then, a second cutting or sawing operation is performed to fully penetrate the carrier 10. The sputtering depth can be carefully controlled. Therefore, element 16 may be selectively sputtered without overlapping or covering the conductive layer 11a in the first direction (e.g., the x-axis) as shown in FIG. 1A.

Figure 3A:
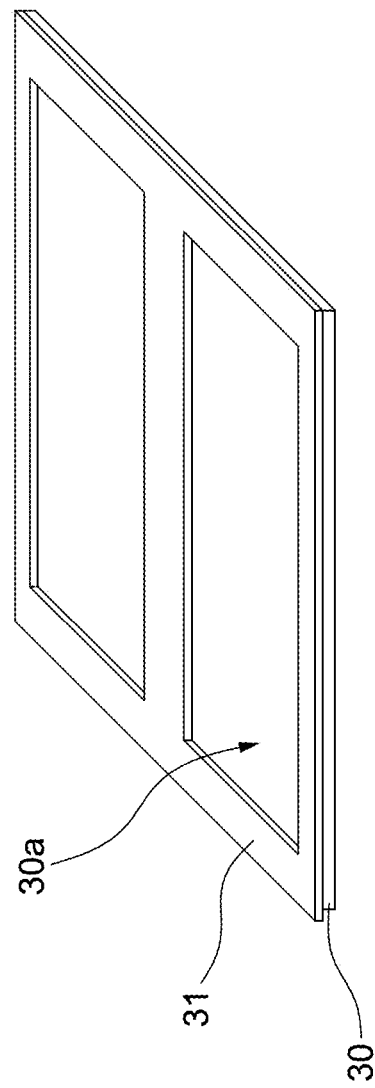
Figures 1, 3B:
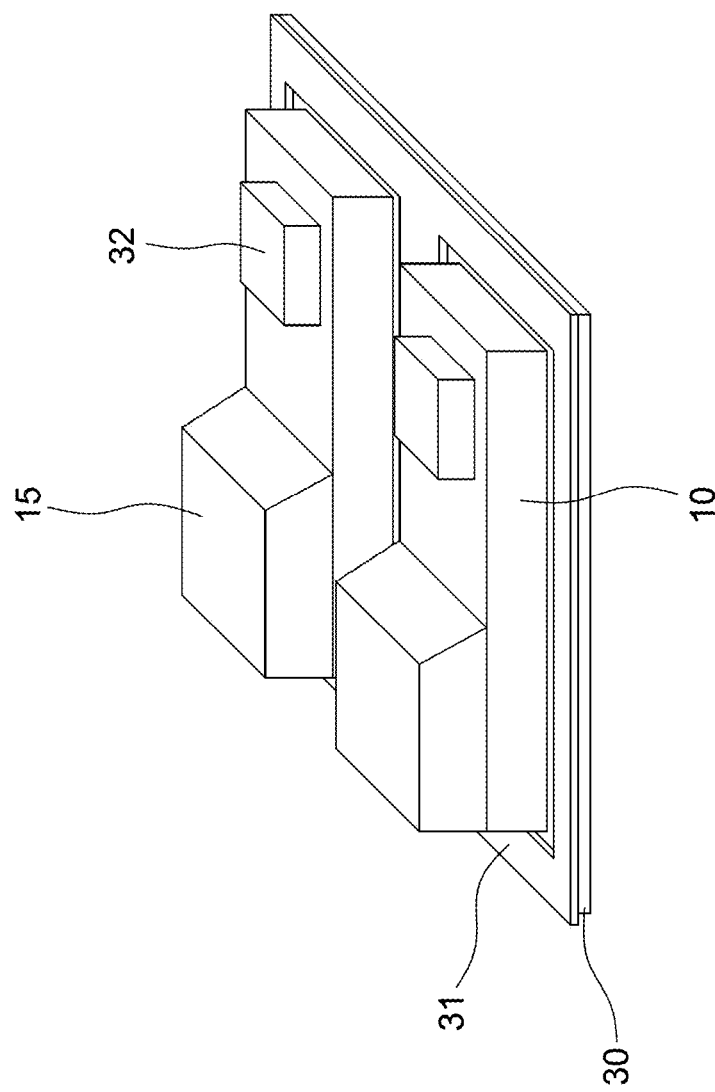
Figures 2, 3B:
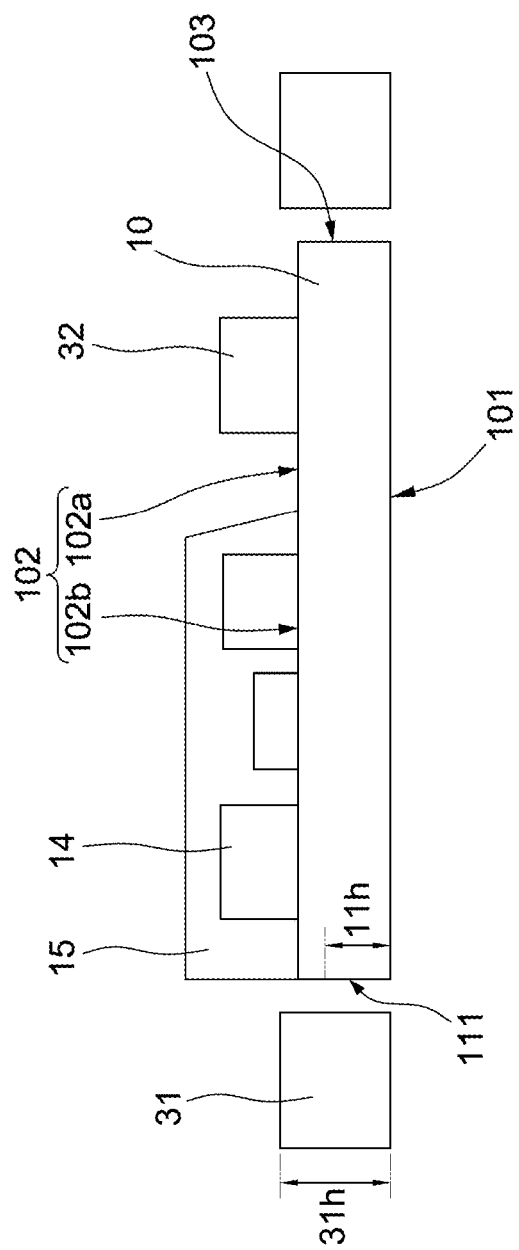

FIG. 3A, FIG. 3B-1, FIG. 3C, FIG. 3D, and FIG. 3E illustrate perspective views in one or more stages of a method of manufacturing an electronic device in accordance with an embodiment of the present disclosure. FIG. 3B-2 illustrate a cross-sectional view of the perspective view in FIG. 3B-1. At least some of these figures have been simplified to better understand the aspects of the present disclosure. In some embodiments, the electronic device 1 and/or the electronic device 2 may be manufactured through the operations described below with respect to FIG. 3A, FIG. 3B-1, FIG. 3B-2, FIG. 3C, FIG. 3D, and FIG. 3E.

Referring to FIG. 3A, a supporting carrier 30 may be provided. The supporting carrier 30 may include a blocking structure 31 to define an area 30a. For example, the blocking structure 31 may have an opening exposing the area 30a.

Referring to FIG. 3B-1 and FIG. 3B-2, the carrier 10 may be placed on the supporting carrier 30 and within the area 30a. The carrier 10 may be surrounded by the blocking structure 31. In some embodiments, a height 31h of the blocking structure 31 may be substantially greater or larger than a height 11h of an antenna layer (such as the radiating region 11 in FIG. 1A) in the carrier 10. The lateral surface 111 of an antenna layer (such as the radiating region 11 in FIG. 1A) in the carrier 10 may be laterally overlapped with or covered by the blocking structure 31.

In some embodiments, a gap may be defined between the surface 103 of the carrier 10 and the blocking structure 31. In some embodiments, the gap may be controlled to be small enough such that conductive elements (such as the element 16 in FIG. 1A) may not be disposed within the gap in the following operations.

In some embodiments, an electronic component 32 may be disposed on the region 102a of the surface 102 of the carrier 10 to provide electrical connections with external components. The electronic component 32 may be the same as or similar to the electronic component 21. The encapsulant 15 may be formed on the region 102b of the surface 102 of the carrier 10 to encapsulate the electronic component 14.

Figure 3C:
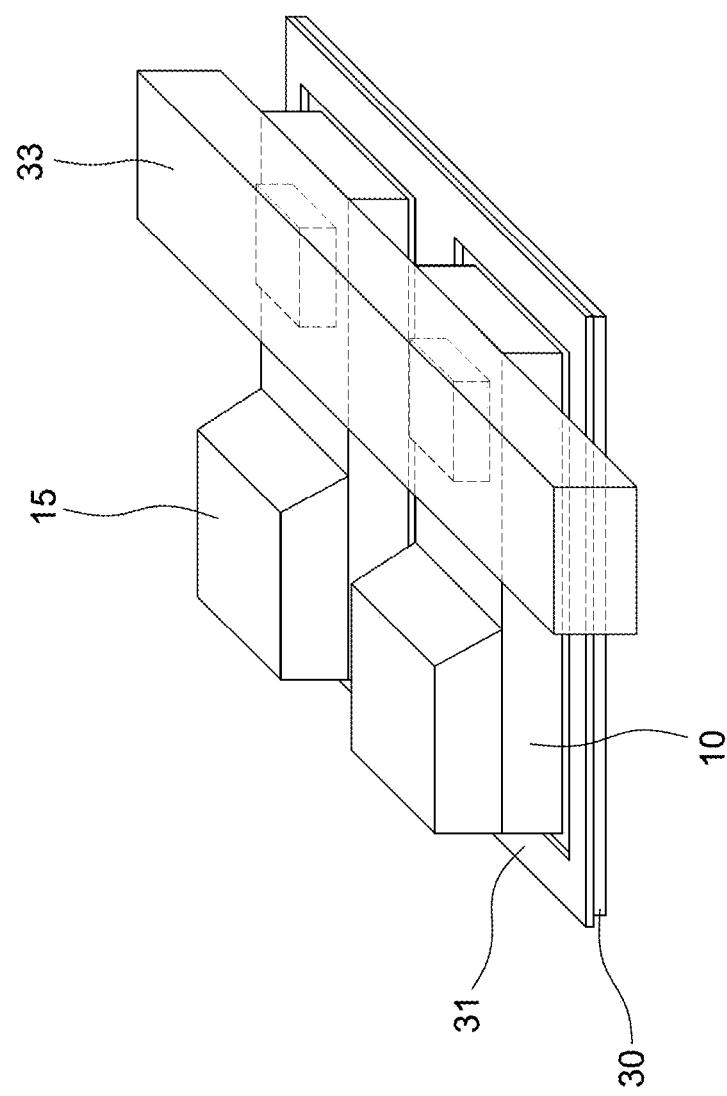

Referring to FIG. 3C, a protection layer 33 may be disposed on the region 102a of the surface 102 to cover the electronic component 32. In some embodiments, the protection layer 33 may prevent the electronic component 32 from being covered by conductive elements (such as the element 16 in FIG. 1A) in the following operations. In some embodiments, the protection layer 33 may be or include, for example, a thermally stable tape, such as PI.

Figure 3D:
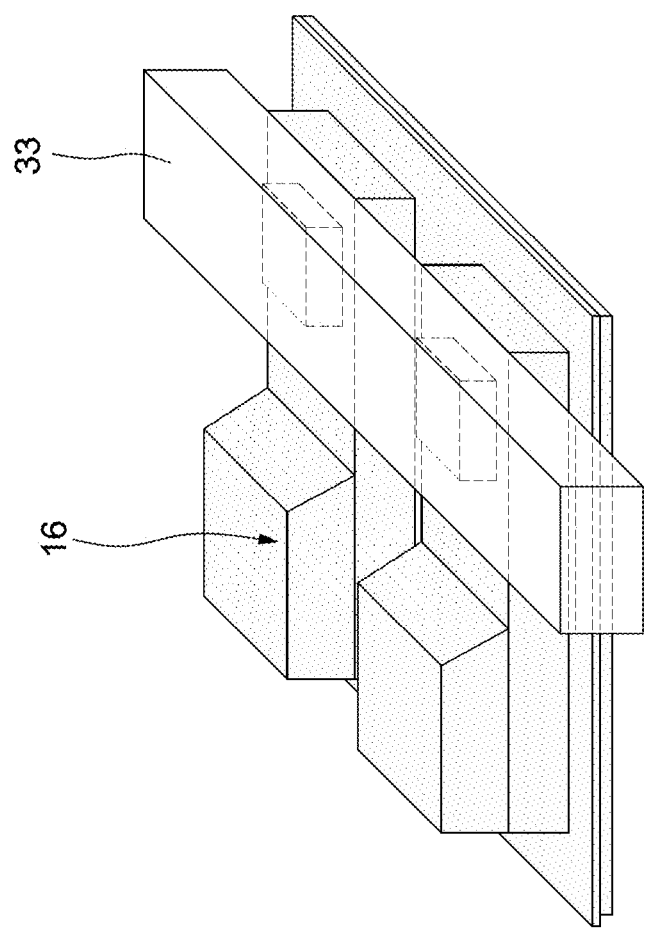

Referring to FIG. 3D, the element 16 may be disposed on the exposed surfaces of the encapsulant 15. In some embodiments, the element 16 may also be disposed on the exposed surfaces of the protection layer 33.

Figure 3E:
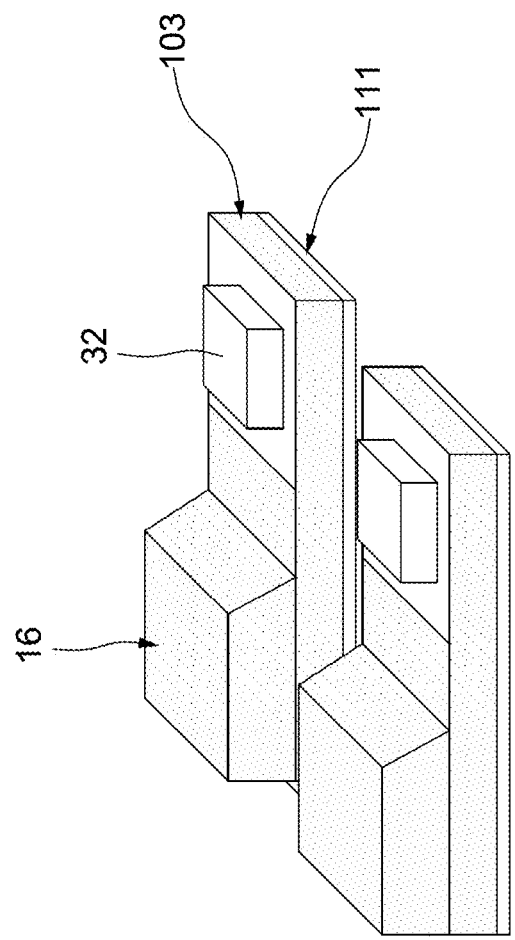

Referring to FIG. 3E, the protection layer 33 may be removed from the region 102a of the surface 102. The carrier 10 may be removed from the supporting carrier 30. The surface 103 of the carrier 10 may be covered by the element 16. The lateral surface 111 of an antenna layer (such as the radiating region 11 in FIG. 1A) in the carrier 10 may be exposed from the element 16.

In comparison with the existing approaches, in the present disclosure, the supporting carrier 30 is used to protect the antenna layer (e.g., the conductive layer 11a). The sputtering depth can be carefully controlled through the height 31h of the blocking structure 31 and the gap between the carrier 10 and the blocking structure 31. Therefore, element 16 may be selectively sputtered without overlapping or covering the conductive layer 11a in the first direction (e.g., the x-axis) as shown in FIG. 1A.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a carrier having an antenna region, a first surface over the antenna region, a second surface above the first surface, and a lateral surface between the first surface and the second surface, wherein the first surface is substantially non-perpendicular to the second surface and a recess is recessed from the lateral surface into the carrier;
an encapsulant disposed on a first region of the second surface of the carrier;
a shielding element on the first surface and separated from the antenna region, wherein the shielding element is disposed on external surfaces of the encapsulant; and
an electronic component disposed on a second region of the second surface of the carrier and configured to electrically connect the carrier to an external element,
wherein the encapsulant comprises a first lateral surface facing the second region of the second surface of the carrier and a second lateral surface opposite to the first lateral surface, and wherein a slope of the first lateral surface is different from a slope of the second lateral surface.

2. The electronic device of claim 1, wherein the lateral surface of the carrier and the first surface of the carrier both in contact with the shielding element.

3. The electronic device of claim 1, wherein a non-antenna region of the carrier comprises a conductive layer exposed to the recess and electrically connected with the shielding element.

4. The electronic device of claim 1, wherein the shielding element is disposed on the lateral surface of the carrier.

* * * * *